United States Patent
Masuda et al.

(10) Patent No.: US 9,787,276 B2
(45) Date of Patent: *Oct. 10, 2017

(54) ELECTRONIC COMPONENT (71) Applicant: Murata Manufacturing Co., Ltd., Nagaokakyo-shi, Kyoto-fu (JP)

(72) Inventors: Hiroshi Masuda, Nagaokakyo (JP); Tomoshiro Isoshima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,505

(22) Filed: Apr. 21, 2016

(65) Prior Publication Data

US 2016/0233845 A1    Aug. 11, 2016

Related U.S. Application Data

(63) Continuation of application No. PCT/JP2014/063451, filed on May 21, 2014.

(30) Foreign Application Priority Data

Oct. 30, 2013    (JP) ................................. 2013-225463

(51) Int. Cl.
*H01F 5/00*    (2006.01)
*H03H 7/01*    (2006.01)
(Continued)

(52) U.S. Cl.
CPC ............ *H03H 7/0115* (2013.01); *H01F 5/00* (2013.01); *H01F 17/00* (2013.01); *H01F 27/00* (2013.01);
(Continued)

(58) Field of Classification Search
CPC . H01F 5/00; H01F 27/00–27/30; H01P 1/213; H03H 7/01
(Continued)

(56) References Cited

U.S. PATENT DOCUMENTS

| | | | | |
|---|---|---|---|---|
| 5,977,845 A | * | 11/1999 | Kitahara | ............... H03H 7/0115 333/184 |
| 2002/0163405 A1 | * | 11/2002 | Miyazaki | .............. H01P 1/2039 333/204 |

(Continued)

FOREIGN PATENT DOCUMENTS

| JP | 2005-159514 A | 6/2005 |
|---|---|---|
| JP | 2006-190934 A | 7/2006 |

(Continued)

OTHER PUBLICATIONS

Official Communication issued in International Application PCT/JP2014/063451, dated Jul. 29, 2014.

*Primary Examiner* — Tuyen Nguyen
(74) *Attorney, Agent, or Firm* — Keating & Bennett, LLP (57) ABSTRACT

An electronic component includes a device body and first through n-th LC parallel resonators connected in series with each other. The first through n-th LC parallel resonators respectively include first through n-th inductors and first through n-th capacitors. The first through n-th inductors are disposed in a first direction in the device body in this order. The first and n-th inductors are provided with a spiral shape or a helical shape such that they turn around respective winding axes extending along a second direction which is perpendicular or substantially perpendicular or substantially perpendicular or substantially perpendicular to the first direction. At least one of the second through (n−1)-th inductors is provided with a helical shape such that it turns around a winding axis extending along the first direction.

18 Claims, 6 Drawing Sheets

(51) Int. Cl.
*H01G 4/40* (2006.01)
*H01F 17/00* (2006.01)
*H01F 27/00* (2006.01)
H03H 7/09 (2006.01)
H03H 1/00 (2006.01)

(52) U.S. Cl.
CPC ............ *H01G 4/40* (2013.01); *H03H 7/1725* (2013.01); *H03H 7/09* (2013.01); *H03H 2001/0085* (2013.01)

(58) Field of Classification Search
USPC .......................... 336/200, 232; 333/120–132
See application file for complete search history.

(56) References Cited

U.S. PATENT DOCUMENTS

| | | | |
|---|---|---|---|
| 2006/0145805 A1 | 7/2006 | Kim et al. | |
| 2009/0189714 A1* | 7/2009 | Sakisaka | H03H 7/0115 333/185 |
| 2010/0033267 A1 | 2/2010 | Mizutani et al. | |
| 2010/0171565 A1* | 7/2010 | Okada | H03H 7/463 333/132 |
| 2013/0009726 A1 | 1/2013 | Sasaki | |

FOREIGN PATENT DOCUMENTS

| | | |
|---|---|---|
| JP | 2013-21449 A | 1/2013 |
| WO | 2008/114681 A1 | 9/2008 |

* cited by examiner

ELECTRONIC COMPONENT

BACKGROUND OF THE INVENTION

1. Field of the Invention

The present invention relates to an electronic component, and more particularly, to an electronic component including three or more LC parallel resonators.

2. Description of the Related Art

As an invention concerning an electronic component of the related art, a three-dimensional spiral inductor disclosed in Japanese Unexamined Patent Application Publication No. 2006-190934 (FIG. 16a), for example, is known. This three-dimensional spiral inductor is a helical coil which is disposed within a multilayer body and which turns around a winding axis extending in a direction perpendicular or substantially perpendicular to a stacking direction of the multilayer body. Such a three-dimensional spiral inductor is used in, for example, a low pass filter.

A low pass filter using three-dimensional spiral inductors is defined by a plurality of LC parallel resonators connected in series with each other, each being constituted by a three-dimensional spiral inductor and a capacitor. Since a three-dimensional spiral inductor is provided with a helical shape, the air-core diameter thereof is greater than that of a spiral inductor. Accordingly, with the use of a three-dimensional spiral inductor, a higher Q factor can be obtained than with the use of a spiral inductor, thus making it possible to reduce the insertion loss of a low pass filter.

In a low pass filter, three-dimensional spiral inductors are arranged linearly such that the winding axes thereof substantially coincide with each other. Because of this arrangement, the three-dimensional spiral inductors are positioned too close to each other, which intensifies electromagnetic coupling between the three-dimensional spiral inductors. This makes it easier for a high frequency signal to be transmitted between the three-dimensional spiral inductors in the low pass filter, thus failing to obtain a sufficient attenuation in a band other than a pass band of the low pass filter.

SUMMARY OF THE INVENTION

Accordingly, preferred embodiments of the present invention provide an electronic component in which a sufficient attenuation is obtained in a band other than a pass band while insertion loss is being reduced.

An electronic component according to a preferred embodiment of the present invention includes a device body and first through n-th LC parallel resonators (n is an integer of three or more) connected in series with each other. The first through n-th LC parallel resonators respectively include first through n-th inductors and first through n-th capacitors. The first through n-th inductors are disposed in the device body such that the first through n-th inductors are arranged in a first direction in order from the first inductor to the n-th inductor. The first and n-th inductors are provided with a spiral shape or a helical shape such that the first and n-th inductors turn around respective winding axes extending along a second direction which is perpendicular or substantially perpendicular to the first direction. At least one of the second through (n−1)-th inductors is provided with a helical shape such that the at least one of the second through (n−1)-th inductors turns around a winding axis extending along the first direction.

According to various preferred embodiments of the present invention, it is possible to obtain a sufficient attenuation in a band other than a pass band while insertion loss is being reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the present invention will now be described below.

Figure 1A:
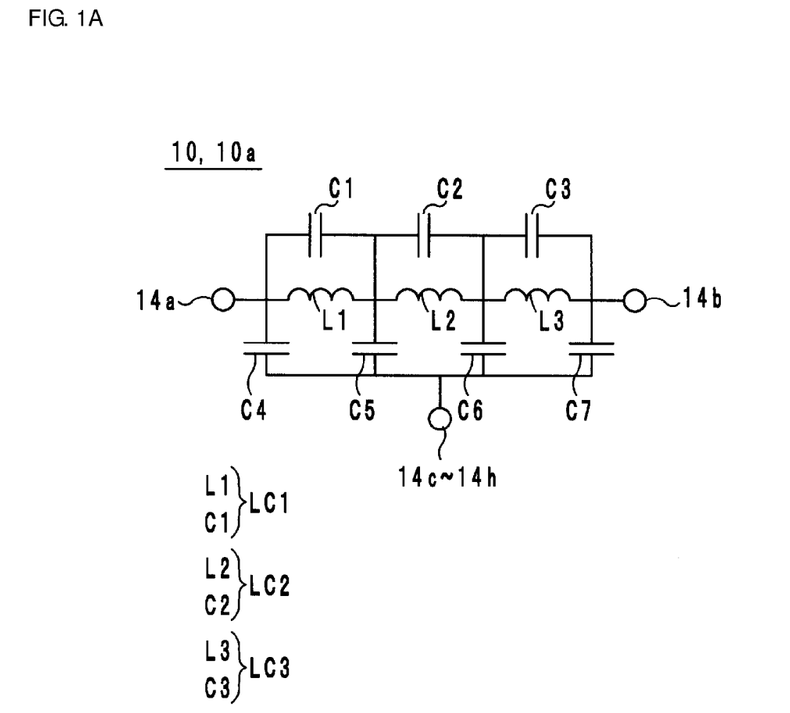
FIG. 1A is an equivalent circuit diagram of an electronic component 10 according to a preferred embodiment of the present invention.
Figure 1B:
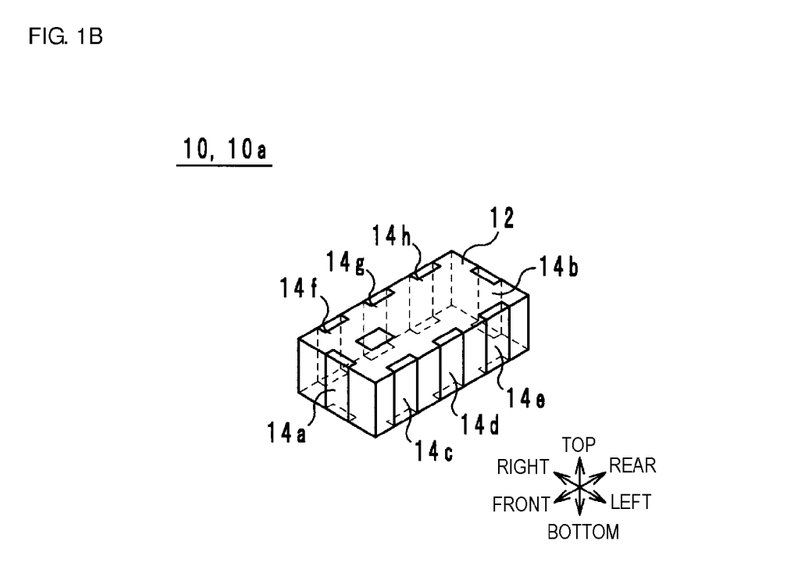
FIG. 1B is an external perspective view of the electronic component 10 shown in FIG. 1A.
Figure 2A:
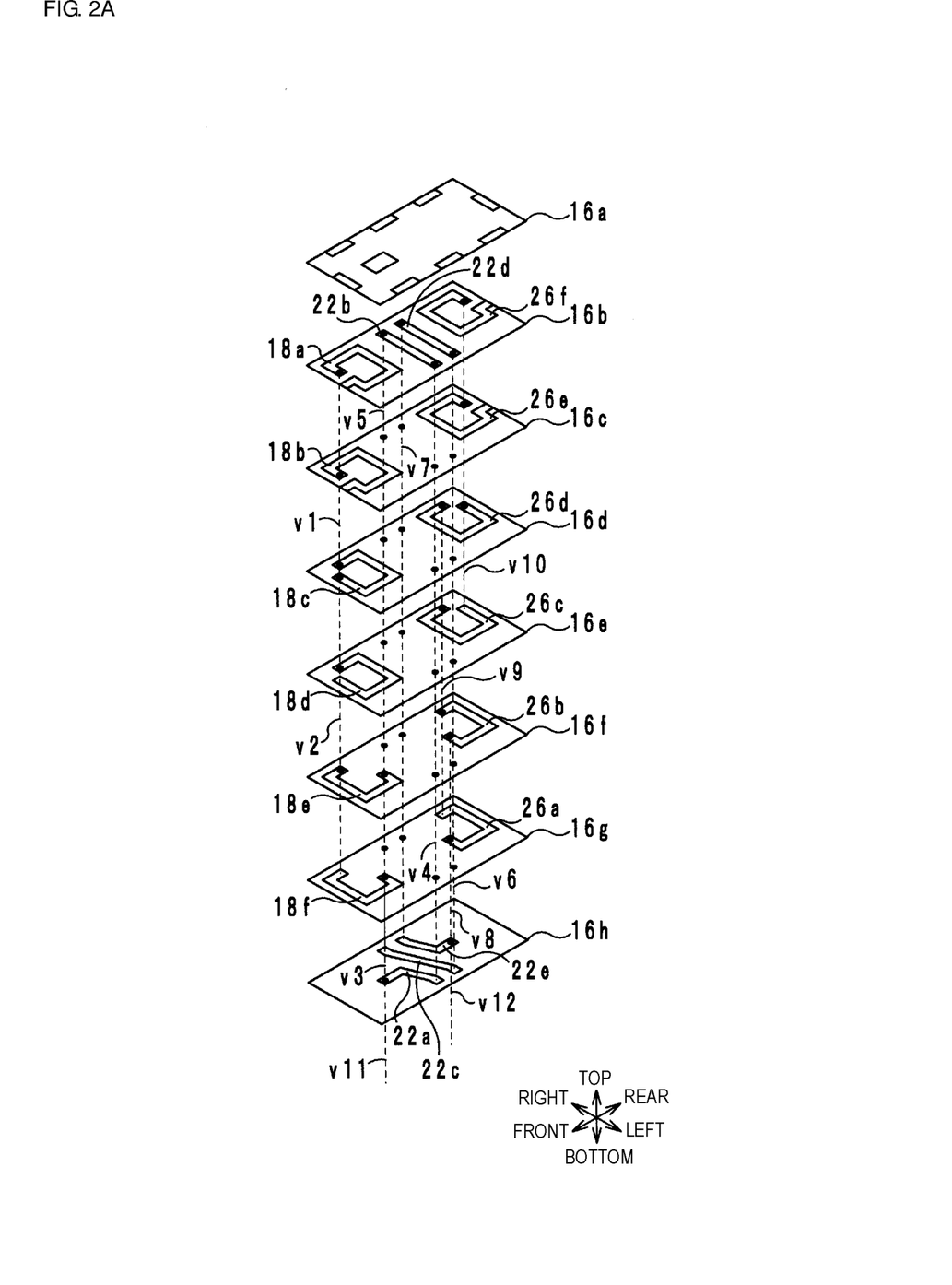
FIG. 2A is an exploded perspective view of a multilayer body 12 of the electronic component 10.
Figure 2B:
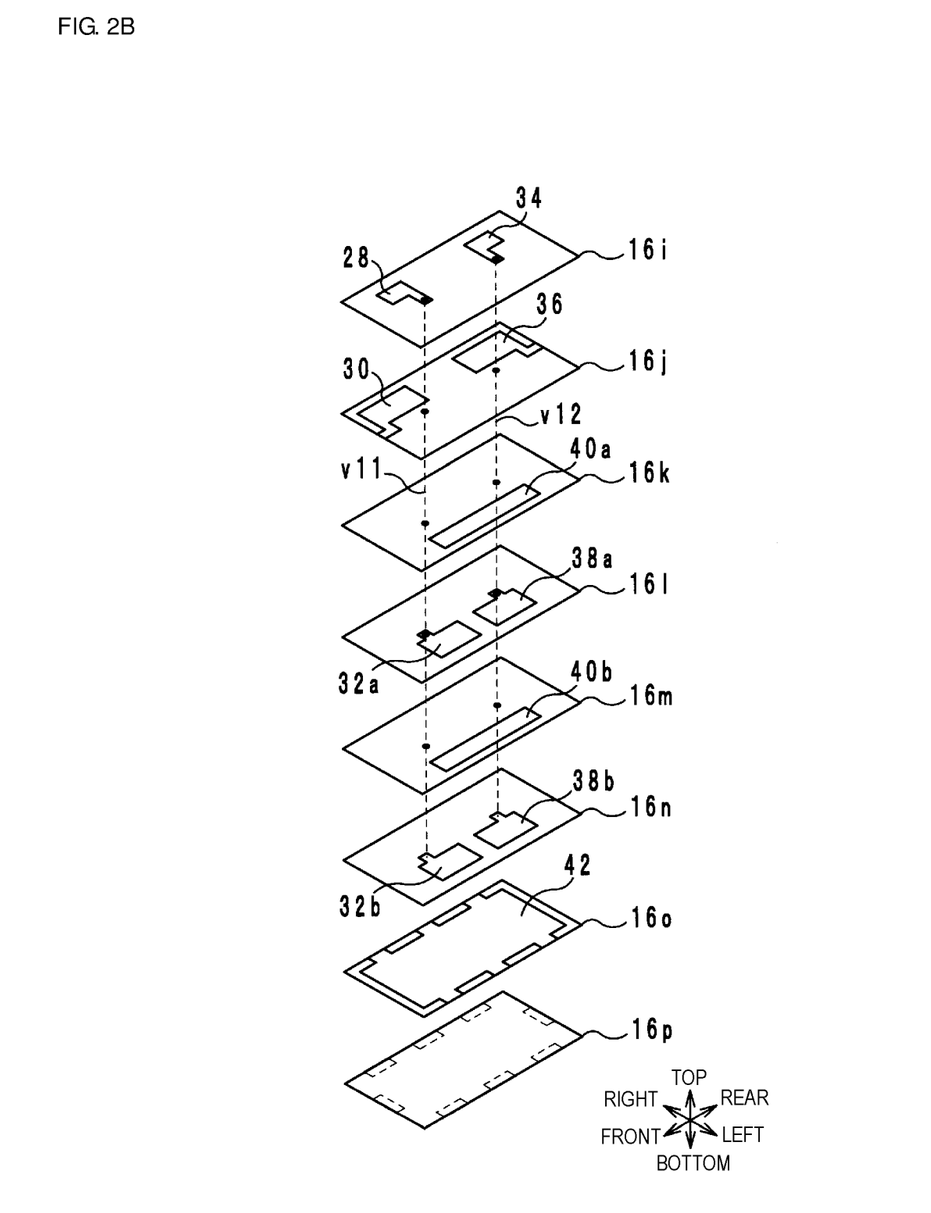
FIG. 2B is an exploded perspective view of the multilayer body 12 of the electronic component 10.

A configuration of a filter according to a preferred embodiment of the present invention will be described below with reference to the drawings. FIG. 1A is an equivalent circuit diagram of an electronic component 10 according to a preferred embodiment of the present invention. FIG. 1B is an external perspective view of the electronic component 10 shown in FIG. 1A. FIGS. 2A and 2B are exploded perspective views of a multilayer body 12 of the electronic component 10. Hereinafter, it is assumed that the top-bottom direction is a stacking direction of insulating layers 16. The direction along the long sides of the electronic component 10 as viewed from above is defined as a front-rear direction, and the direction along the short sides of the electronic component 10 as viewed from above is defined as a right-left direction. The top-bottom direction, the front-rear direction, and the right-left direction are perpendicular or substantially perpendicular to each other.

The equivalent circuit of the electronic component 10 includes, as shown in FIG. 1A, LC parallel resonators LC1 through LC3, capacitors C4 through C7, and outer terminals 14a through 14h. The LC parallel resonator LC1 includes an inductor L1 and a capacitor C1. The LC parallel resonator LC2 includes an inductor L2 and a capacitor C2. The LC parallel resonator LC3 includes an inductor L3 and a capacitor C3. The LC parallel resonators LC1 through LC3 are connected in series with each other in this order between the outer terminals 14a and 14b. The resonant frequency of the LC parallel resonator LC2 is lower than that of the LC parallel resonator LC1 and that of the LC parallel resonator LC3.

The capacitor C4 is disposed between a node between the outer terminal 14a and the LC parallel resonator LC1 and the outer terminals 14c through 14h. The capacitor C5 is disposed between a node between the LC parallel resonators LC1 and LC2 and the outer terminals 14c through 14h. The capacitor C6 is disposed between a node between the LC parallel resonators LC2 and LC3 and the outer terminals 14c through 14h. The capacitor C7 is disposed between a node between the LC parallel resonator LC3 and the outer terminal 14b and the outer terminals 14c through 14h.

The electronic component 10 with the unique structure described above is used as a low pass filter. The outer terminal 14a is used as an input terminal, the outer terminal 14b is used as an output terminal, and the outer terminals 14c through 14h are used as ground terminals.

The electronic component 10 includes, as shown in FIGS. 1B, 2A, and 2B, the multilayer body 12, the outer terminals 14a through 14h, inductor conductors 18a through 18f, 22a through 22e, and 26a through 26f, capacitor conductors 28, 30, 32a, 32b, 34, 36, 38a, 38b, 40a, and 40b, a ground conductor 42, and via-hole conductors v1 through v12.

As shown in FIGS. 1B, 2A, and 2B, the multilayer body 12 is defined by insulating layers 16a through 16p stacked on each other in the top-bottom direction, and preferably has a shape of a rectangular or substantially rectangular parallelepiped. The multilayer body 12 includes therein the LC parallel resonators LC1 through LC3 and the capacitors C4 through C7.

As shown in FIGS. 2A and 2B, the insulating layers 16a through 16p preferably are provided with a rectangular or substantially rectangular shape and are made of, for example, a ceramic dielectric. The insulating layers 16a through 16p are stacked on each other such that they are arranged from the top side to the bottom side in this order. Hereinafter, the upper surfaces of the insulating layers 16a through 16p will be referred to as "the top surfaces", and the lower surfaces of the insulating layers 16a through 16p will be referred to as "the bottom surfaces".

The inductor L1 is provided with a helical shape such that it turns around a winding axis extending in parallel or substantially in parallel with the top-bottom direction. The inductor L1 is disposed near the front surface of the multilayer body 12. The inductor L1 is defined by the inductor conductors 18a through 18f and the via-hole conductors v1 and v2. The inductor conductors 18a and 18b are linear conductive layers disposed on the top surfaces of the insulating layers 16b and 16c, respectively. The inductor conductors 18a and 18b are linear conductive layers which extend, by a small distance, from the center of the short front sides of the insulating layers 16b and 16c, respectively, toward the rear sides, and then turn through about one revolution in the counterclockwise direction, as viewed from above. However, the lengths of the inductor conductors 18a and 18b are slightly shorter than those corresponding to one revolution. Accordingly, the downstream end portions of the inductor conductors 18a and 18b in the counterclockwise direction are located at positions toward the right side from the center of the short front sides of the insulating layers 16b and 16c, respectively.

The inductor conductors 18c and 18d are linear conductive layers disposed on the top surfaces of the insulating layers 16d and 16e, respectively. The inductor conductors 18c and 18d are linear conductive layers which start turning at positions on the right side of the center of the short front sides of the insulating layers 16d and 16e, respectively, through about one revolution in the counterclockwise direction, as viewed from above. However, the lengths of the inductor conductors 18c and 18d are slightly shorter than those corresponding to one revolution. Accordingly, the downstream end portions of the inductor conductors 18c and 18d in the counterclockwise direction are located near the front ends of the long right sides of the insulating layers 16d and 16e, respectively. As viewed from above, the upstream end portions of the inductor conductors 18c and 18d in the counterclockwise direction are superposed on the downstream end portions of the inductor conductors 18a and 18b in the counterclockwise direction.

The inductor conductors 18e and 18f are linear conductive layers disposed on the top surfaces of the insulating layers 16f and 16g, respectively. The inductor conductors 18e and 18f are linear conductive layers which start turning at positions near the front ends of the long right sides of the insulating layers 16f and 16g, respectively, through about ½ revolutions in the counterclockwise direction, as viewed from above. However, the lengths of the inductor conductors 18e and 18f are slightly longer than those corresponding to ½ revolutions. Accordingly, the downstream end portions of the inductor conductors 18e and 18f in the counterclockwise direction are located at positions toward the front side from the center (the intersection point of diagonal lines) of the insulating layers 16f and 16g, respectively. As viewed from above, the upstream end portions of the inductor conductors 18e and 18f in the counterclockwise direction are superposed on the downstream end portions of the inductor conductors 18c and 18d in the counterclockwise direction.

The via-hole conductor v1 is an interlayer connecting conductor which passes through the insulating layers 16b through 16d in the top-bottom direction. The via-hole conductor v1 is preferably formed, for example, by connecting a plurality of via-hole conductors which pass through the respective insulating layers 16b through 16d. The via-hole conductor v1 connects the downstream end portions of the inductor conductors 18a and 18b in the counterclockwise direction and the upstream end portions of the inductor conductors 18c and 18d in the counterclockwise direction.

The via-hole conductor v2 is an interlayer connecting conductor which passes through the insulating layers 16d through 16f in the top-bottom direction. The via-hole conductor v2 is preferably formed, for example, by connecting a plurality of via-hole conductors which pass through the respective insulating layers 16d through 16f. The via-hole conductor v2 connects the downstream end portions of the inductor conductors 18c and 18d in the counterclockwise direction and the upstream end portions of the inductor conductors 18e and 18f in the counterclockwise direction.

The inductor L1 with the unique structure described above is provided with a helical shape such that it advances from the top side to the bottom side while turning around counterclockwise, as viewed from above.

The inductor L3 is provided with a helical shape such that it turns around a winding axis extending in parallel or substantially in parallel with the top-bottom direction. The inductor L3 is disposed near the rear surface of the multilayer body 12. The inductor L3 is defined by the inductor conductors 26a through 26f and the via-hole conductors v9 and v10. The inductor conductors 26a and 26b are linear conductive layers disposed on the top surfaces of the insulating layers 16g and 16f, respectively. The inductor conductors 26a and 26b are linear conductive layers which start turning at positions on the rear side of the center of the insulating layers 16g and 16f, respectively, through about ½ revolutions in the counterclockwise direction, as viewed from above. However, the lengths of the inductor conductors 26a and 26b are slightly longer than those corresponding to ½ revolutions. Accordingly, the downstream end portions of the inductor conductors 26a and 26b in the counterclockwise direction are located near the rear ends of the long right sides of the insulating layers 16g and 16f, respectively.

The inductor conductors 26c and 26d are linear conductive layers disposed on the top surfaces of the insulating layers 16e and 16d, respectively. The inductor conductors 26c and 26d are linear conductive layers which start turning at positions near the rear ends of the long right sides of the insulating layers 16e and 16d, respectively, through about one revolution in the counterclockwise direction, as viewed from above. However, the lengths of the inductor conductors 26c and 26d are slightly shorter than those corresponding to one revolution. Accordingly, the downstream end portions of the inductor conductors 26c and 26d in the counterclockwise direction are located at positions toward the right side from the center of the short rear sides of the insulating layers 16e and 16d, respectively. As viewed from above, the upstream end portions of the inductor conductors 26c and 26d in the counterclockwise direction are superposed on the downstream end portions of the inductor conductors 26a and 26b in the counterclockwise direction.

The inductor conductors 26e and 26f are linear conductive layers disposed on the top surfaces of the insulating layers 16c and 16b, respectively. The inductor conductors 26e and 26f are linear conductive layers which start turning at positions on the right side of the center of the short rear sides of the insulating layers 16c and 16b, respectively, through about one revolution in the counterclockwise direction, as viewed from above. However, the lengths of the inductor conductors 26e and 26f are slightly shorter than those corresponding to one revolution. The downstream end portions of the inductor conductors 26e and 26f in the counterclockwise direction extend to the center of the short rear sides of the insulating layers 16c and 16b, respectively. As viewed from above, the upstream end portions of the inductor conductors 26e and 26f in the counterclockwise direction are superposed on the downstream end portions of the inductor conductors 26c and 26d in the counterclockwise direction.

The via-hole conductor v9 is an interlayer connecting conductor which passes through the insulating layers 16d through 16f in the top-bottom direction. The via-hole conductor v9 is preferably formed, for example, by connecting a plurality of via-hole conductors which pass through the respective insulating layers 16d through 16f. The via-hole conductor v9 connects the downstream end portions of the inductor conductors 26a and 26b in the counterclockwise direction and the upstream end portions of the inductor conductors 26c and 26d in the counterclockwise direction.

The via-hole conductor v10 is an interlayer connecting conductor which passes through the insulating layers 16b through 16d in the top-bottom direction. The via-hole conductor v10 is preferably formed, for example, by connecting a plurality of via-hole conductors which pass through the respective insulating layers 16b through 16d. The via-hole conductor v10 connects the downstream end portions of the inductor conductors 26c and 26d in the counterclockwise direction and the upstream end portions of the inductor conductors 26e and 26f in the counterclockwise direction.

The inductor L3 with the unique structure described above is provided with a helical shape such that it advances from the bottom side to the top side while turning around counterclockwise, as viewed from above.

The inductor L2 is provided with a helical shape such that it turns around a winding axis extending in parallel or substantially in parallel with the front-rear direction. The inductor L2 is disposed near the center of the multilayer body in the front-rear direction. That is, the inductor L2 is disposed between the inductors L1 and L3. With this arrangement, the inductors L1, L2, and L3 are disposed from the front side to the rear side in this order.

The inductor L2 is defined by the inductor conductors 22a through 22e and the via-hole conductors v4 through v7. The inductor conductors 22a, 22c, and 22e are linear conductive layers arranged from the front side to the rear side in this order on the top surface of the insulating layer 16h.

The inductor conductor 22a is a conductor including one corner portion, which extends, by a small distance, from a position on the front side of the front-rear center of the insulating layer 16h toward the rear side, and then extends toward the rear left side. The left end of the inductor conductor 22a is located at a position slightly toward the front side from the center of the long left side of the insulating layer 16h.

The inductor conductor 22c is a conductor which extends from a position slightly toward the front side from the center of the long right side of the insulating layer 16h toward the rear left side. The left end of the inductor conductor 22c is located near the center of the long left side of the insulating layer 16h.

The inductor conductor 22e is a conductor including one corner portion, which extends from a position near the center of the long right side of the insulating layer 16h toward the rear left side, and then extends, by a small distance, toward the rear side. The rear end of the inductor conductor 22e is located at a position toward the rear side from the center of the insulating layer 16h.

A portion of the inductor conductor 22a, a portion of the inductor conductor 22c, and a portion of the inductor conductor 22e extend in parallel or substantially in parallel with each other.

The inductor conductors 22b and 22d are linear conductive layers which are arranged from the front side to the rear side in this order on the top surface of the insulating layer 16b. Accordingly, the inductor conductors 22b and 22d are disposed on a level above the inductor conductors 22a, 22c, and 22e.

The inductor conductor 22b extends in the right-left direction at a position toward the front side from the center of the insulating layer 16b. The left end of the inductor conductor 22b is superposed on the left end of the inductor conductor 22a, as viewed from above. The right end of the inductor conductor 22b is superposed on the right end of the inductor conductor 22c, as viewed from above.

The inductor conductor 22d extends in the right-left direction at a position toward the rear side from the center of the insulating layer 16b. The left end of the inductor conductor 22d is superposed on the left end of the inductor conductor 22c, as viewed from above. The right end of the inductor conductor 22d is superposed on the right end of the inductor conductor 22e, as viewed from above.

The inductor conductors 22b and 22d extend in parallel or substantially in parallel with each other.

The via-hole conductor v4 is an interlayer connecting conductor which passes through the insulating layers 16b through 16g in the top-bottom direction. The via-hole conductor v4 is preferably formed, for example, by connecting a plurality of via-hole conductors which pass through the respective insulating layers 16b through 16g. The via-hole conductor v4 connects the left end of the inductor conductor 22a and the left end of the inductor conductor 22b.

The via-hole conductor v5 is an interlayer connecting conductor which passes through the insulating layers 16b through 16g in the top-bottom direction. The via-hole conductor v5 is preferably formed, for example, by connecting a plurality of via-hole conductors which pass through the respective insulating layers 16b through 16g. The via-hole conductor v5 connects the right end of the inductor conductor 22b and the right end of the inductor conductor 22c.

The via-hole conductor v6 is an interlayer connecting conductor which passes through the insulating layers 16b through 16g in the top-bottom direction. The via-hole conductor v6 is preferably formed, for example, by connecting a plurality of via-hole conductors which pass through the respective insulating layers 16b through 16g. The via-hole conductor v6 connects the left end of the inductor conductor 22d and the left end of the inductor conductor 22c.

The via-hole conductor v7 is an interlayer connecting conductor which passes through the insulating layers 16b through 16g in the top-bottom direction. The via-hole conductor v7 is preferably formed, for example, by connecting a plurality of via-hole conductors which pass through the respective insulating layers 16b through 16g. The via-hole conductor v7 connects the right end of the inductor conductor 22d and the right end of the inductor conductor 22e.

The inductor L2 with the unique structure described above is provided with a helical shape such that it advances from the front side to the rear side while turning around counterclockwise, as viewed from the front side.

The capacitor C1 is defined by the capacitor conductors 28 and 30. This will be explained more specifically. The capacitor conductor 30 is a rectangular or substantially rectangular conductive layer which is disposed on the top surface of the insulating layer 16j and which is disposed in a region defined by the right half portion and the front half portion of the insulating layer 16j. The capacitor conductor 30 extends to the center of the short front side of the insulating layer 16j. The capacitor conductor 28 is a rectangular or substantially rectangular conductive layer which is disposed on the top surface of the insulating layer 16i and which is disposed in a region defined by the right half portion and the front half portion of the insulating layer 16i. The capacitor conductor 28 is superposed on the capacitor conductor 30, as viewed from above. With this arrangement, the capacitor conductor 28 opposes the capacitor conductor 30 with the insulating layer 16i interposed therebetween.

The capacitor C2 is defined by the capacitor conductors 32a, 32b, 38a, 38b, 40a, and 40b. This will be explained more specifically. The capacitor conductors 32a and 32b are rectangular or substantially rectangular conductive layers which are respectively disposed on the top surfaces of the insulating layers 16l and 16n and which are respectively disposed in regions defined by the left half portions and the front half portions of the insulating layers 16l and 16n. The capacitor conductors 38a and 38b are rectangular or substantially rectangular conductive layers which are respectively disposed on the top surfaces of the insulating layers 16l and 16n and which are respectively disposed in regions defined by the left half portions and the rear half portions of the insulating layers 16l and 16n. The capacitor conductors 40a and 40b are strip-shaped conductive layers which are respectively disposed on the top surfaces of the insulating layers 16k and 16m and which respectively extend in the front-rear direction in regions defined by the left half portions of the insulating layers 16k and 16m. The capacitor conductors 40a and 40b are superposed on the capacitor conductors 32a, 32b, 38a, and 38b, as viewed from above. With this arrangement, the capacitor conductors 32a and 38a oppose the capacitor conductor 40a with the insulating layer 16k interposed therebetween and oppose the capacitor conductor 40b with the insulating layer 16l interposed therebetween, and the capacitor conductors 32b and 38b oppose the capacitor conductor 40b with the insulating layer 16m interposed therebetween.

The capacitor C3 is defined by the capacitor conductors 34 and 36. This will be explained more specifically. The capacitor conductor 36 is a rectangular or substantially rectangular conductive layer which is disposed on the top surface of the insulating layer 16j and which is disposed in a region defined by the right half portion and the rear half portion of the insulating layer 16j. The capacitor conductor 36 extends to the center of the short rear side of the insulating layer 16j. The capacitor conductor 34 is a rectangular or substantially rectangular conductive layer which is disposed on the top surface of the insulating layer 16i and which is disposed in a region defined by the right half portion and the rear half portion of the insulating layer 16i. The capacitor conductor 34 is superposed on the capacitor conductor 36, as viewed from above. With this arrangement, the capacitor conductor 34 opposes the capacitor conductor 36 with the insulating layer 16i interposed therebetween.

The capacitor C4 is defined by the capacitor conductor and the ground conductor 42. This will be explained more specifically. The ground conductor 42 is a rectangular or substantially rectangular conductive layer which covers the substantially entire surface of the insulating layer 16o, and overlaps the capacitor conductor 30, as viewed from above. With this arrangement, the capacitor conductor 30 opposes the ground conductor 42 with the insulating layers 16j through 16n interposed therebetween. The ground conductor 42 extends to the long left side of the insulating layer 16o at three portions and to the long right side of the insulating layer 16o at three portions.

The capacitor C5 is defined by the capacitor conductor 32b and the ground conductor 42. This will be explained more specifically. The ground conductor 42 overlaps the capacitor conductor 32b, as viewed from above. With this arrangement, the capacitor conductor 32b opposes the ground conductor 42 with the insulating layer 16n interposed therebetween.

The capacitor C6 is defined by the capacitor conductor 38b and the ground conductor 42. This will be explained more specifically. The ground conductor 42 overlaps the capacitor conductor 38b, as viewed from above. With this arrangement, the capacitor conductor 38b opposes the ground conductor 42 with the insulating layer 16n interposed therebetween.

The capacitor C7 is defined by the capacitor conductor and the ground conductor 42. This will be explained more specifically. The ground conductor 42 overlaps the capacitor conductor 36, as viewed from above. With this arrangement, the capacitor conductor 36 opposes the ground conductor 42 with the insulating layers 16j through 16n interposed therebetween.

The via-hole conductor v3 is an interlayer connecting conductor which connects the inductors L1 and L2 in series with each other. More specifically, the via-hole conductor v3 is an interlayer connecting conductor which passes through the insulating layers 16f and 16g in the top-bottom direction. The via-hole conductor v3 is preferably formed, for example, by connecting a plurality of via-hole conductors which pass through the respective insulating layers 16f and 16g. The via-hole conductor v3 connects the downstream end portions of the inductor conductors 18e and 18f in the counterclockwise direction and the front end of the inductor conductor 22a.

The via-hole conductor v8 is an interlayer connecting conductor which connects the inductors L2 and L3 in series with each other. More specifically, the via-hole conductor v8 is an interlayer connecting conductor which passes through the insulating layers 16f and 16g in the top-bottom direction. The via-hole conductor v8 is preferably formed, for example, by connecting a plurality of via-hole conductors which pass through the respective insulating layers 16f and 16g. The via-hole conductor v8 connects the upstream end portions of the inductor conductors 26a and 26b in the counterclockwise direction and the rear end of the inductor conductor 22e.

The via-hole conductor v11 is an interlayer connecting conductor which connects the inductors L1 and L2 and the capacitors C1, C2, and C5. More specifically, the via-hole conductor v11 is an interlayer connecting conductor which passes through the insulating layers 16h through 16m in the top-bottom direction. The via-hole conductor v11 is preferably formed, for example, by connecting a plurality of via-hole conductors which pass through the respective insulating layers 16h through 16m. The via-hole conductor v11 connects the front end of the inductor conductor 22a and the capacitor conductors 28, 32a, and 32b.

The via-hole conductor v12 is an interlayer connecting conductor which connects the inductors L2 and L3 and the capacitors C2, C3, and C6. More specifically, the via-hole conductor v12 is an interlayer connecting conductor which passes through the insulating layers 16h through 16m in the top-bottom direction. The via-hole conductor v12 is preferably formed, for example, by connecting a plurality of via-hole conductors which pass through the respective insulating layers 16h through 16m. The via-hole conductor v12 connects the rear end of the inductor conductor 22e and the capacitor conductors 34, 38a, and 38b.

The outer terminal 14a is disposed, as shown in FIG. 1B, such that it extends in the top-bottom direction on the front surface of the multilayer body 12. With this arrangement, the outer terminal 14a is connected to the inductor conductors 18a and 18b and the capacitor conductor 30. That is, the outer terminal 14a is connected to the inductor L1 and the capacitors C1 and C4.

The outer terminal 14b is disposed, as shown in FIG. 1B, such that it extends in the top-bottom direction on the rear surface of the multilayer body 12. With this arrangement, the outer terminal 14b is connected to the inductor conductors 26e and 26f and the capacitor conductor 36. That is, the outer terminal 14b is connected to the inductor L3 and the capacitors C3 and C7.

The outer terminals 14c, 14d, and 14e are disposed, as shown in FIG. 1B, such that they are arranged from the front side to the rear side in this order on the left surface of the multilayer body 12. The outer terminals 14c through 14e extend in the top-bottom direction. With this arrangement, the outer terminals 14c through 14e are connected to the ground conductor 42. That is, the outer terminals 14c through 14e are connected to the capacitors C4 through C7.

The outer terminals 14f, 14g, and 14h are disposed, as shown in FIG. 1B, such that they are arranged from the front side to the rear side in this order on the right surface of the multilayer body 12. The outer terminals 14f through 14h extend in the top-bottom direction. With this arrangement, the outer terminals 14f through 14h are connected to the ground conductor 42. That is, the outer terminals 14f through 14h are connected to the capacitors C4 through C7.

A non-limiting example of a manufacturing method for the electronic component 10 will now be discussed below with reference to FIGS. 1A, 1B, 2A, and 2B.

First, ceramic green sheets, which will be used as the insulating layers 16a through 16p, are prepared. Then, the via-hole conductors v1 through v12 are formed in the ceramic green sheets which will be used as the insulating layers 16b through 16m. More specifically, by applying a laser beam to the ceramic green sheets which will be used as the insulating layers 16b through 16m, via-holes are formed. Then, a conductive paste made of Ag, Pd, Cu, Au, or an alloy thereof is filled into the via-holes by print coating.

Then, a conductive paste made of Ag, Pd, Cu, Au, or an alloy thereof as a principal component is applied to the top surfaces of the ceramic green sheets which will be used as the insulating layers 16b through 16o by using a screen printing or photolithographic process, thus forming the inductor conductors 18a through 18f, 22a through 22e, and 26a through 26f, the capacitor conductors 28, 30, 32a, 32b, 34, 36, 38a, 38b, 40a, and 40b, and the ground conductor 42. A conductive paste may be filled into the via-holes when forming the inductor conductors 18a through 18f, 22a through 22e, and 26a through 26f, the capacitor conductors 28, 30, 32a, 32b, 34, 36, 38a, 38b, 40a, and 40b, and the ground conductor 42.

Then, the ceramic green sheets are stacked on each other. More specifically, the ceramic green sheets, which will be used as the insulating layers 16a through 16p, are stacked and pressure-bonded to each other one by one. According to the above-described process, a mother multilayer body is formed. Then, this mother multilayer body is subjected to final pressure-bonding by, for example, isostatic pressing.

Then, the mother multilayer body is cut into multilayer bodies 12 having a predetermined size by using a cutting blade.

According to the above-described process, unfired multilayer bodies 12 are obtained. Then, barrel finishing is performed on each unfired multilayer body 12, thus chamfering the unfired multilayer body 12. Then, debinding and firing is performed on the unfired multilayer body 12.

Finally, by applying a conductive paste made of Ag, Pd, Cu, Au, or an alloy thereof as a principal component to the top surface of the multilayer body 12, underlayer electrodes, which will form the outer terminals 14a through 14h, are formed. Then, Ni-plating/Sn-plating is performed on the top surfaces of the underlayer electrodes so as to form the outer terminals 14a through 14h. According to the above-described process, the electronic component 10 is formed. Firing of the multilayer body may be performed after forming the outer terminals 14a through 14h. More specifically, the mother multilayer body is cut into the multilayer bodies 12, barrel finishing is performed on each multilayer body 12, the outer terminals 14a through 14h are formed by applying a conductive paste, and then, the multilayer body 12 is fired.

By using the electronic component 10 with the unique structure described above, it is possible to reduce the insertion loss. This will be explained more specifically. In the electronic component 10, the inductor L2 preferably is a helical inductor. Since the air-core diameter of a helical inductor is larger than that of a spiral inductor, it is possible to increase the Q factor of the inductor L2. Additionally, the inductance value of the helical inductor L2 is greater than that of a spiral inductor. Thus, it is possible to reduce the insertion loss of the electronic component 10.

In the electronic component 10, it is possible to obtain a sufficient attenuation in a band other than the pass band. This will be explained more specifically. In the electronic component 10, the inductors L1 through L3 are disposed from the front side to the rear side in this order. The inductors L1 and L3 are provided in a helical shape such that they turn around the winding axes extending in parallel with the top-bottom direction. The inductor L2 is provided with a helical shape such that it turns around the winding axis extending in parallel with the front-rear direction. That is, the winding axes of the inductors L1 and L3 are perpendicular or substantially perpendicular to the winding axis of the inductor L2. Electromagnetic coupling between the inductors L1 and L2 and between the inductors L2 and L3 is weaker in a case in which the winding axes of the inductors L1 and L3 are perpendicular or substantially perpendicular to the winding axis of the inductor L2 than that in a case in which the winding axes of the inductors L1 through L3 coincide with each other. With this configuration, it is more difficult for a high frequency signal to be transmitted between the inductors L1 and L2 and between the inductors L2 and L3. As a result, it is possible to obtain a sufficient attenuation in a band other than the pass band.

Figure 3:
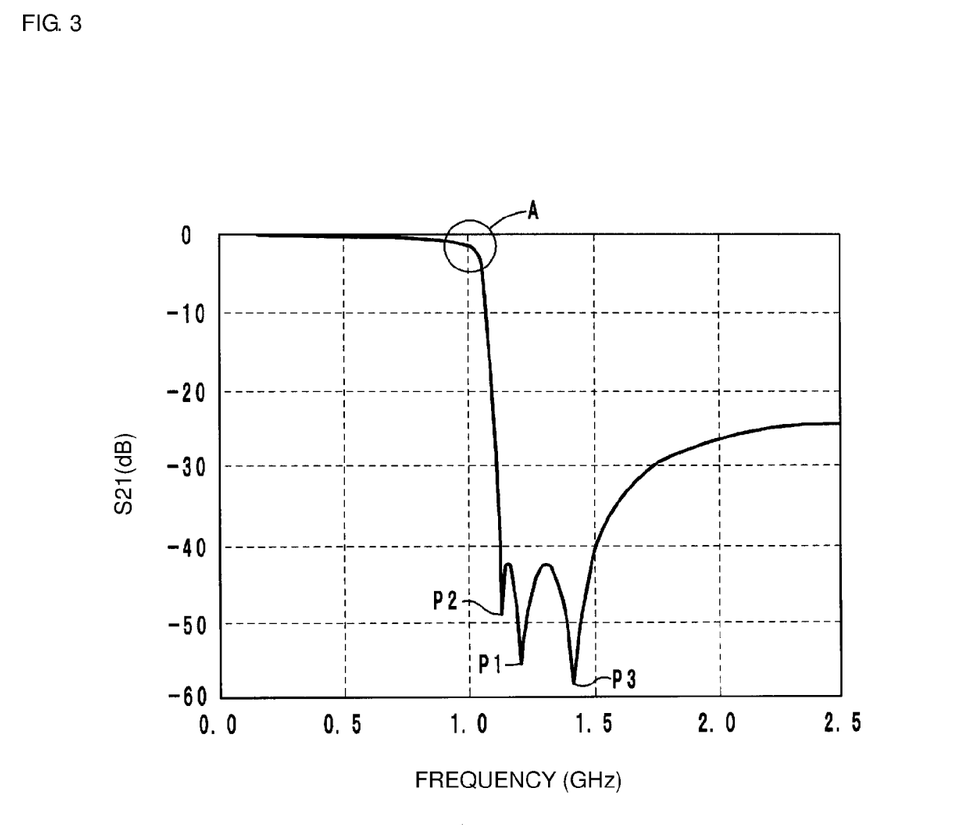
FIG. 3 is a graph illustrating a S21 of the electronic component 10.

In the electronic component 10, it is preferable that the resonant frequency of the LC parallel resonator LC2 be lower than that of each of the LC parallel resonators LC1 and LC3. With this arrangement, when the electronic component 10 is used as a low pass filter, the S21 of the electronic component 10 sharply falls from the highest frequency of the pass band. FIG. 3 is a graph illustrating the S21 of the electronic component 10. The vertical axis indicates the S21, while the horizontal axis indicates the frequency.

This will be explained more specifically. If the resonant frequency of the LC parallel resonator LC2 is lower than that of each of the LC parallel resonators LC1 and LC3, an attenuation pole P2 is provided by the LC parallel resonator LC2, an attenuation pole P1 is provided by the LC parallel resonator LC1, and an attenuation pole P3 is provided by the LC parallel resonator LC3. The frequency of the attenuation pole P2 is lower than that of each of the attenuation poles P1 and P3, and is positioned near the highest frequency of the pass band. In the electronic component 10 with the unique structure described above, if the inductor L2 of the LC parallel resonator LC2, which provides the attenuation pole P2, preferably is a helical inductor having a high Q factor, the insertion loss near the attenuation pole P2 is reduced. As a result, the S21 sharply falls from the highest frequency of the pass band, as indicated by portion A in FIG. 3.

In the electronic component 10, the degree of coupling between the inductors L1 and L2 is able to be adjusted. This will be explained more specifically. The inductor L1 is connected to the capacitor C5 through the via-hole conductors v3 and v11, and the inductor L2 is connected to the capacitor C5 through the via-hole conductor v11. That is, the inductors L1 and L2 are connected to the capacitor C5 through the single via-hole conductor v11. The via-hole conductor v11 defines and functions as an inductor. Accordingly, the inductor L1 and the via-hole conductor v11 are electromagnetically coupled with each other, while the inductor L2 and the via-hole conductor v11 are electromagnetically coupled with each other. Thus, the inductors L1 and L2 are electromagnetically coupled with each other through the via-hole conductor v11. Accordingly, by adjusting the length of the via-hole conductor v11, the degree of coupling between the inductors L1 and L2 is able to be adjusted. In a similar principle, the degree of coupling between the inductors L2 and L3 is also able to be adjusted.

In the electronic component 10, a reduction in the resistance of the inductors L1 and L3 is implemented. This will be explained by taking the inductor L1 as an example. In the inductor L1, the inductor conductors 18a and 18b are connected in parallel with each other, the inductor conductors 18c and 18d are connected in parallel with each other, and the inductor conductors 18e and 18f are connected in parallel with each other. With this arrangement, a reduction in the resistance of the inductor L1 is implemented. For the same reason, a reduction in the resistance of the inductor L3 is also implemented. In the inductor L2, as well as in the inductors L1 and L3, inductor conductors may be connected in parallel with each other.

In the electronic component 10, when a current flows through the inductors L1 through L3, the direction in which the current flows through the inductor L1 is the same as that of the inductor L3.

In the electronic component 10, the capacitors C4 through C7 are disposed. Among high frequency signals which pass through the LC parallel resonators LC1 through LC3, high frequency signals having a frequency higher than the pass band flow to a ground via the capacitors C4 through C7. This makes it possible to further enhance the function of the electronic component 10 as a low pass filter.

Figure 4A:
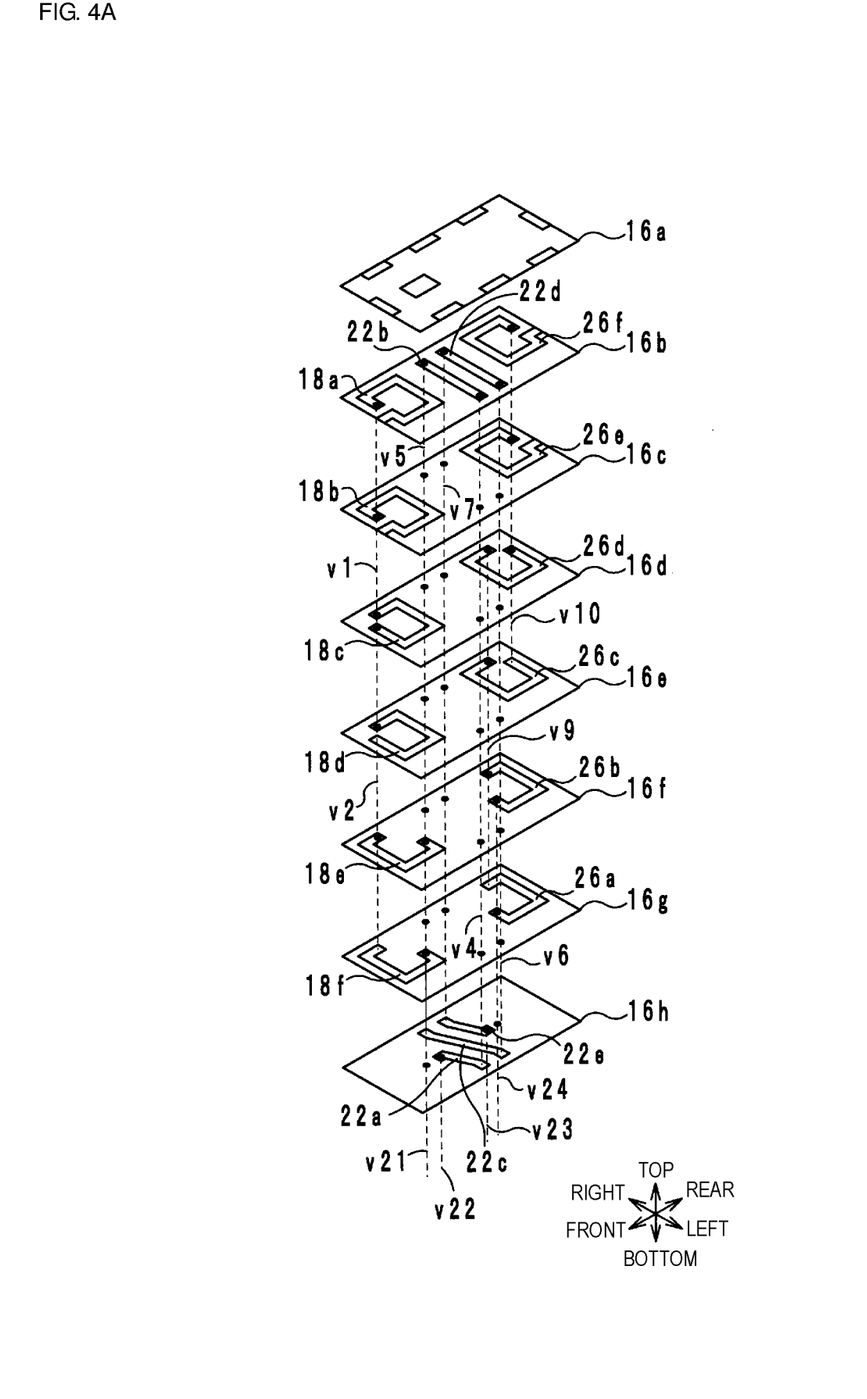
FIG. 4A is an exploded perspective view of a multilayer body 12 of an electronic component 10a according to a modified example of a preferred embodiment of the present invention.
Figure 4B:
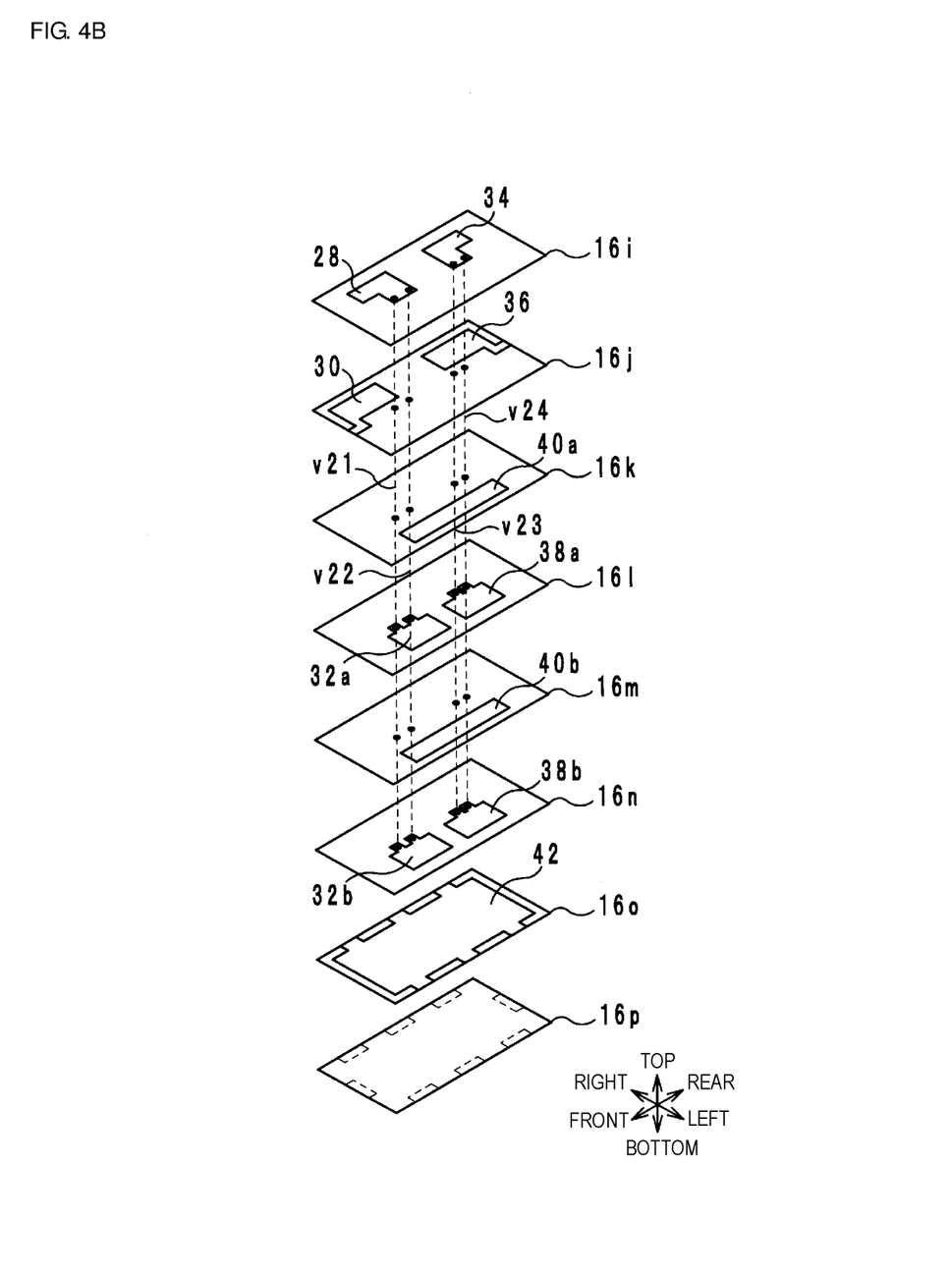
FIG. 4B is an exploded perspective view of the multilayer body 12 of the electronic component 10a according to a modified example of a preferred embodiment of the present invention.

An electronic component according to a modified example of a preferred embodiment of the present invention will be described below with reference to the drawings. FIGS. 4A and 4B are exploded perspective views of a multilayer body 12 of an electronic component 10a according to the modified example. As an equivalent circuit diagram and an external perspective view of the electronic component 10a, FIGS. 1A and 1B are used.

The electronic component 10a is different from the electronic component 10 in the structure in which each of the inductors L1 and L2 is connected to the capacitor C5 and in the structure in which each of the inductors L2 and L3 is connected to the capacitor C6. The configuration of the electronic component 10a will be described below by mainly referring to these different points.

In the electronic component 10a, instead of the via-hole conductors v3, v8, v11, and v12, via-hole conductors v21 through v24 are provided.

The via-hole conductor v21 is an interlayer connecting conductor which connects the inductor L1 and the capacitor C5. This will be explained more specifically. The via-hole conductor v21 is an interlayer connecting conductor which passes through the insulating layers 16f through 16m in the top-bottom direction. The via-hole conductor v21 is preferably formed, for example, by connecting a plurality of via-hole conductors which pass through the respective insulating layers 16f through 16m. The via-hole conductor v21 connects the downstream end portions of the inductor conductors 18e and 18f in the counterclockwise direction and the capacitor conductors 28, 32a, and 32b.

The via-hole conductor v22 is an interlayer connecting conductor which connects the inductor L2 and the capacitor C5. This will be explained more specifically. The via-hole conductor v22 is an interlayer connecting conductor which passes through the insulating layers 16h through 16m in the top-bottom direction. The via-hole conductor v22 is preferably formed, for example, by connecting a plurality of via-hole conductors which pass through the respective insulating layers 16h through 16m. The via-hole conductor v22 connects the front end of the inductor conductor 22a and the capacitor conductors 28, 32a, and 32b.

The via-hole conductor v23 is an interlayer connecting conductor which connects the inductor L2 and the capacitor C6. This will be explained more specifically. The via-hole conductor v23 is an interlayer connecting conductor which passes through the insulating layers 16h through 16m in the top-bottom direction. The via-hole conductor v23 is preferably formed, for example, by connecting a plurality of via-hole conductors which pass through the respective insulating layers 16h through 16m. The via-hole conductor v23 connects the rear end of the inductor conductor 22e and the capacitor conductors 34, 38a, and 38b.

The via-hole conductor v24 is an interlayer connecting conductor which connects the inductor L3 and the capacitor C6. This will be explained more specifically. The via-hole conductor v24 is an interlayer connecting conductor which passes through the insulating layers 16f through 16m in the top-bottom direction. The via-hole conductor v24 is preferably formed, for example, by connecting a plurality of via-hole conductors which pass through the respective insulating layers 16f through 16m. The via-hole conductor v24 connects the upstream end portions of the inductor conductors 26a and 26b in the counterclockwise direction and the capacitor conductors 34, 38a, and 38b.

In the electronic component 10a with the unique structure described above, it is possible to increase the attenuation. This will be explained more specifically. In the electronic component 10a, the via-hole conductor v21 which connects the inductor L1 and the capacitor C5 and the via-hole conductor v22 which connects the inductor L2 and the capacitor C5 are provided separately from each other. In this case, the inductor L1 and the via-hole conductor v21 which connects the inductor L1 and the capacitor C5 define a single inductor, while the inductor L2 and the via-hole conductor v22 which connects the inductor L2 and the capacitor C5 define a single inductor. Then, the two inductors are directly connected to the capacitor C5, unlike the electronic component 10 in which the corresponding two inductors are connected to the capacitor C5 through a single via-hole conductor. Accordingly, unlike the electronic component 10, the two inductors are not electromagnetically coupled with each other through a single via-hole conductor. As a result, the degree of coupling between the inductors L1 and L2 is decreased, thus making it possible to increase the attenuation of the electronic component 10a. In a similar principle, the degree of coupling between the inductors L2 and L3 is also decreased.

Other Preferred Embodiments

Electronic components according to the present invention are not restricted to the electronic components 10 and 10a, and may be modified within the scope of the present invention.

The number of LC parallel resonators is not restricted to three, and may be four or more. If n LC parallel resonators LC1 through LCn are provided, inductors L1 and Ln of the LC parallel resonators LC1 and LCn, which are respectively positioned at both ends in the front-rear direction, are provided in a helical shape such that they turn around the winding axes extending in parallel or substantially in parallel with the top-bottom direction. At least one of the inductors of the LC parallel resonators LC2 through LCn−1 is provided with a helical shape such that it turns around the winding axis extending in parallel or substantially in parallel with the front-rear direction. In this case, it is preferable that the resonant frequencies of the LC parallel resonators LC1 and LCn respectively disposed near the outer terminals 14a and 14b are higher than those of the LC parallel resonators LC2 through LCn−1.

Additionally, the coil diameter of at least one of the inductors of the LC parallel resonators LC2 through LCn−1 may not have to be the same throughout the entire length of the inductor. By changing the coil diameter, the inductance value may be adjusted so that a suitable inductance value can be obtained.

The winding axes of the inductors L1 and L3 preferably extend in parallel or substantially in parallel with the top-bottom direction. However, the winding axes of the inductors L1 and L3 may be slightly displaced from the top-bottom direction. That is, it is sufficient if the winding axes of the inductors L1 and L3 extend along the top-bottom direction.

The winding axis of the inductor L2 preferably extends in parallel or substantially in parallel with the front-rear direction. However, the winding axis of the inductor L2 may be slightly displaced from the front-rear direction. That is, it is sufficient if the winding axis of the inductor L2 extends along the front-rear direction.

When a current flows through the inductors L1 through L3, the direction in which the current flows through the inductor L1 may be opposite to that of the inductor L3. This makes it possible to decrease the electromagnetic coupling between the inductors L1 and L3.

In the electronic components 10 and 10a, the inductor conductors 22b and 22d preferably are disposed on the insulating layer 16b. However, the inductor conductors 22b and 22d may be distributed among different insulating layers. In this manner, by changing the positions of the inductor conductors 22b and 22d in the top-bottom direction, the air-core diameter of the inductor L2 is able to be adjusted, thus making it possible to adjust the inductance value of the inductor L2. For the same reason, the inductor conductors 22a, 22c, and 22e may be distributed among different insulating layers.

The inductors L1 and L3 may be provided with a spiral shape such that they turn around the winding axes along the top-bottom direction. A spiral inductor is an inductor having a shape such that it advances from the center to the outer periphery or from the outer periphery to the center while turning around multiple times on the substantially same plane, as viewed from above.

It is not always necessary that both of the capacitors C4 and C5 be provided, and it is sufficient if at least one of the capacitors C4 and C5 is provided.

Preferred embodiments of the present invention are suitably used as an electronic component, and in particular, are excellent in terms of obtaining a sufficient attenuation in a band other than a pass band while reducing insertion loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a device body; and
   first through n-th LC parallel resonators connected in series with each other where n is an integer of three or more; wherein
   the first through n-th LC parallel resonators respectively include first through n-th inductors and first through n-th capacitors;
   the first through n-th inductors are disposed in the device body such that the first through n-th inductors are arranged in a first direction in order from the first inductor to the n-th inductor;
   the first and n-th inductors are provided with a spiral shape or a helical shape such that the first and n-th inductors turn around respective winding axes extending along a second direction which is perpendicular or substantially perpendicular to the first direction; and at least one of the second through (n−1)-th inductors is provided with a helical shape such that the at least one of the second through (n−1)-th inductors turns around a winding axis extending along the first direction.

2. The electronic component according to claim 1, wherein n is three.

3. The electronic component according to claim 2, wherein a resonant frequency of the second LC parallel resonator is lower than a resonant frequency of the first LC parallel resonator and a resonant frequency of the third LC parallel resonator.

4. The electronic component according to claim 2, further comprising:
an input terminal that is disposed on a surface of the device body and that is connected to the first LC parallel resonator;
an output terminal that is disposed on a surface of the device body and that is connected to the third LC parallel resonator;
a ground terminal disposed on a surface of the device body; and
a capacitor disposed between a node between the input terminal and the first LC parallel resonator and the ground terminal, between a node between the first and second LC parallel resonators and the ground terminal, between a node between the second and third LC parallel resonators and the ground terminal, or between a node between the third LC parallel resonator and the output terminal and the ground terminal.

5. The electronic component according to claim 4, wherein
the device body includes a plurality of insulating layers stacked on each other in the second direction; and
the first through third LC parallel resonators include inner conductors disposed on the corresponding insulating layers and interlayer connecting conductors which pass through the corresponding insulating layers in the second direction.

6. The electronic component according to claim 5, wherein
the capacitor is disposed between the node between the first and second LC parallel resonators and the ground terminal; and
the electronic component further includes:
a first interlayer connecting conductor that connects the first and second inductors in series with each other; and
a second interlayer connecting conductor that connects the second inductor and the capacitor.

7. The electronic component according to claim 5, wherein
the capacitor is disposed between the node between the first and second LC parallel resonators and the ground terminal; and
the electronic component further includes:
a third interlayer connecting conductor that electrically connects the first inductor and the capacitor; and
a fourth interlayer connecting conductor that electrically connects the second inductor and the capacitor.

8. The electronic component according to claim 5, wherein at least one of the first through third inductors is defined by a plurality of inner conductors connected in parallel with each other.

9. The electronic component according to claim 5, wherein
the second inductor includes:
a plurality of first inductor conductors that are disposed on the corresponding insulating layers and that are arranged in parallel or substantially in parallel with each other in the first direction;
a plurality of second inductor conductors that are disposed on the corresponding insulating layer positioned farther toward one side of the second direction than the plurality of first inductor conductors and that are arranged in parallel with each other in the first direction, one end portion of the corresponding second inductor conductor being superposed on one end portion of the corresponding first inductor conductor located on one side of the first direction, as viewed from a plane in the second direction, and the other end portion of the corresponding second inductor conductor being superposed on the other end portion of the corresponding first inductor conductor located on the other side of the first direction, as viewed from a plane in the second direction;
a plurality of fifth interlayer connecting conductors that each connect one end portion of the corresponding first inductor conductor and one end portion of the corresponding second inductor conductor; and
a plurality of sixth interlayer connecting conductors that each connect the other end portion of the corresponding first inductor conductor and the other end portion of the corresponding second inductor conductor; and
the plurality of first inductor conductors are distributed among a plurality of the insulating layers.

10. The electronic component according to claim 2, wherein the first and third inductors are provided with a helical shape.

11. The electronic component according to claim 2, wherein the first and third inductors are provided with a spiral shape.

12. The electronic component according to claim 1, wherein n is four or more.

13. The electronic component according to claim 1, wherein resonant frequencies of the second through (n−1)-th LC parallel resonators are lower than a resonant frequency of the first LC parallel resonator and a resonant frequency of the n-th LC parallel resonator.

14. The electronic component according to claim 1, wherein at least one of the first through n-th inductors has a diameter that changes along a length thereof.

15. The electronic component according to claim 1, wherein the first direction is a top-bottom direction.

16. The electronic component according to claim 15, wherein the winding axes are displaced from the top-bottom direction.

17. The electronic component according to claim 1, wherein current flows through at least one of the first through n-th inductors in a direction that is different from a current that flows through at least another of the first through n-th inductors.

18. The electronic component according to claim 1, wherein the electronic component is a low pass filter.

* * * * *